(12) United States Patent
Saputra et al.

(10) Patent No.: US 11,424,396 B2
(45) Date of Patent: Aug. 23, 2022

(54) FLIP CHIP LED WITH SIDE REFLECTORS AND PHOSPHOR

(71) Applicant: Lumileds LLC, San Jose, CA (US)

(72) Inventors: Iwan-Wahyu Saputra, Singapore (SG); Yeow-Meng Teo, Singapore (SG)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/067,016

(22) PCT Filed: Dec. 13, 2016

(86) PCT No.: PCT/US2016/066413
§ 371 (c)(1),
(2) Date: Jun. 28, 2018

(87) PCT Pub. No.: WO2017/116693
PCT Pub. Date: Jul. 6, 2017

(65) Prior Publication Data
US 2019/0027662 A1    Jan. 24, 2019

Related U.S. Application Data

(60) Provisional application No. 62/272,416, filed on Dec. 29, 2015.

(30) Foreign Application Priority Data

Mar. 15, 2016    (EP) .................................... 16160421

(51) Int. Cl.
*H01L 33/60*    (2010.01)
*H01L 33/48*    (2010.01)
(Continued)

(52) U.S. Cl.
CPC .............. *H01L 33/60* (2013.01); *H01L 33/46* (2013.01); *H01L 33/486* (2013.01); *H01L 33/50* (2013.01);
(Continued)

(58) Field of Classification Search
CPC ......... H01L 33/46; H01L 33/50; H01L 33/60; H01L 33/0093; H01L 33/36;
(Continued)

(56) References Cited

U.S. PATENT DOCUMENTS

| 7,919,229 B2 | 4/2011 | Chao et al. |
| 8,093,615 B2 | 1/2012 | Kim et al. |

(Continued)

FOREIGN PATENT DOCUMENTS

| EP | 1 995 780 | 11/2008 |
| EP | 3076444 A1 | 10/2016 |

(Continued)

OTHER PUBLICATIONS

Extended European Search Report dated Sep. 16, 2016 for European Patent Application No. 16160421.0.
(Continued)

*Primary Examiner* — Khiem D Nguyen
(74) *Attorney, Agent, or Firm* — Volpe Koenig (57) ABSTRACT

An array of light emitting devices is mounted on a support surface with the transparent growth substrate (e.g., sapphire) facing up. A photoresist layer is then deposited over the top surface of the growth substrate, followed by depositing a reflective material over the top and side surfaces of the light emitting devices to encapsulate the light emitting devices. The top surfaces of the light emitting devices are then ground down to remove the reflective material over the top surface of the photoresist. The photoresist is then dissolved to leave a cavity over the growth substrate having reflective walls. The cavity is then filled with a phosphor. The phosphor-converted light emitting devices are then singulated to form packaged light emitting devices. All side light is reflected back into the light emitting device by the reflective material and eventually exits the light emitting device
(Continued)

toward the phosphor. The packaged light emitting devices, when energized, appear as a white dot with no side emission (e.g., no blue halo).

12 Claims, 7 Drawing Sheets (51) Int. Cl.
*H01L 33/46* (2010.01)
*H01L 33/50* (2010.01)
*H01L 33/56* (2010.01)

(52) U.S. Cl.
CPC .......... *H01L 33/505* (2013.01); *H01L 33/56* (2013.01); *H01L 2933/0033* (2013.01); *H01L 2933/0041* (2013.01); *H01L 2933/0058* (2013.01)

(58) Field of Classification Search
CPC ... H01L 33/382; H01L 33/385; H01L 33/387; H01L 33/405; H01L 33/502; H01L 2293/0041
USPC .......................................................... 257/98
See application file for complete search history.

(56) References Cited

U.S. PATENT DOCUMENTS

| 8,431,423 | B2 | 4/2013 | Basin et al. |
| 8,633,503 | B2 | 1/2014 | Seo |
| 8,877,528 | B2 | 11/2014 | Ooyabu et al. |
| 9,070,851 | B2* | 6/2015 | Seo .......... H01L 33/44 |
| 9,116,269 | B2 | 8/2015 | Deschaseaux |
| 9,190,398 | B2 | 11/2015 | Tu et al. |
| 9,257,617 | B2* | 2/2016 | Bierhuizen .......... H01L 27/156 |
| 9,490,390 | B2 | 11/2016 | Yoneda et al. |
| 9,748,450 | B2 | 8/2017 | Brandl et al. |
| 10,147,843 | B2 | 12/2018 | Epler et al. |
| 10,249,802 | B2 | 4/2019 | Baike et al. |
| 11,063,192 | B2 | 7/2021 | Tamaki et al. |
| 11,127,887 | B2 | 9/2021 | Masui et al. |
| 2003/0146480 | A1 | 8/2003 | Abiko |
| 2008/0290351 | A1 | 11/2008 | Ajiki et al. |
| 2010/0279437 | A1* | 11/2010 | Neff .......... H01L 33/0095 438/14 |
| 2012/0019922 | A1* | 1/2012 | Deschaseaux .......... G02B 1/10 359/614 |
| 2012/0153330 | A1 | 6/2012 | Tsutsui |
| 2012/0248477 | A1* | 10/2012 | Tischler .......... F21K 9/238 257/89 |
| 2014/0362603 | A1 | 12/2014 | Song et al. |
| 2015/0050760 | A1* | 2/2015 | Imazu .......... H01L 33/50 438/27 |
| 2015/0129918 | A1* | 5/2015 | Ikegami .......... H01L 33/507 257/98 |
| 2016/0123557 | A1 | 5/2016 | Xu et al. |
| 2017/0288095 | A1* | 10/2017 | Cheng .......... H01L 33/44 |

FOREIGN PATENT DOCUMENTS

| EP | 3125310 A1 | 2/2017 |
| JP | 2012-156443 A | 8/2012 |
| WO | 2013/061228 | 5/2013 |
| WO | 2014/167455 A2 | 10/2014 |
| WO | 2015/036887 | 3/2015 |
| WO | 2017/023502 A1 | 2/2017 |

OTHER PUBLICATIONS

International Preliminary Report on Patentability Chapter I dated Jul. 3, 2018 for PCT International Application No. PCT/US2016/066413.

International Search Report dated Feb. 27, 2017 for PCT International Application No. PCT/US2016/066413.

Communication pursuant to Article 94(3) EPC dated Oct. 14, 2019 for European Patent Application No. 16819255.7.

* cited by examiner

FIG. 17

FLIP CHIP LED WITH SIDE REFLECTORS AND PHOSPHOR

CROSS-REFERENCE TO RELATED APPLICATIONS

The present application claims priority to U.S. Provisional Patent Application No. 62/272,416 titled, "FLIP CHIP LED WITH SIDE REFLECTORS AND PHOSPHOR", filed Dec. 29, 2015 and European Patent Application No. EP16160421.0 titled, "FLIP CHIP LED WITH SIDE REFLECTORS AND PHOSPHOR", filed Mar. 15, 2016. U.S. Provisional Patent Application No. 62/272,416 and European Patent Application No. EP16160421.0 are incorporated herein.

FIELD OF THE INVENTION

This invention relates to packaged light emitting devices and, in particular, to a technique to reduce side emission in a phosphor-converted light emitting device.

BACKGROUND

As the footprint of light emitting devices becomes smaller, the ratio of the area of the top emission surface vs. the area of the side surfaces lowers. This means that a higher percentage of the emitted light is emitted from the sides of the semiconductor chip. For example, if a phosphor is deposited only over the top surface of a blue LED for generating white light, the resulting light emission will be a white spot surrounded by a blue halo.

Therefore, what is needed is a technique for packaging a light emitting device with phosphor over the top surface of the chip, where substantially all light is emitted from the top surface toward the phosphor.

SUMMARY

In the example of a blue flip-chip LED, where the blue light is to be converted to white light using a phosphor, a technique is disclosed wherein an array of LEDs is mounted on a support surface with the transparent growth substrate (e.g., sapphire) facing up. The growth substrate may be thinned and roughened by polishing for improving light extraction.

A photoresist layer, or other removable layer, is then deposited over the top surface of the growth substrate, followed by blanket-depositing a reflective material over the top and side surfaces of the LEDs to encapsulate the LEDs.

The top surfaces of the LEDs are then ground down to remove the reflective material over the top surface of the photoresist. The photoresist is then dissolved to leave a cavity over the growth substrate with reflective walls.

The cavity is then filled with a phosphor.

Thus, all side light is reflected back into the LED by the reflective material and eventually exits the LED toward the phosphor. Any side light from the phosphor is reflected back into the phosphor by the reflective walls of the cavity.

The phosphor-converted LEDs are then singulated to form packaged LEDs. The packaged LED, when energized, appears as a white dot with no side emission (i.e., no blue halo).

The technique is particularly beneficial for LEDs having a small footprint, where side emission is more problematic.

The above description is of one embodiment of the invention. Additional features and embodiments are described herein.

BRIEF DESCRIPTION OF THE DRAWINGS

Elements that are the same or similar are labeled with the same numeral.

DETAILED DESCRIPTION

Figure 1:
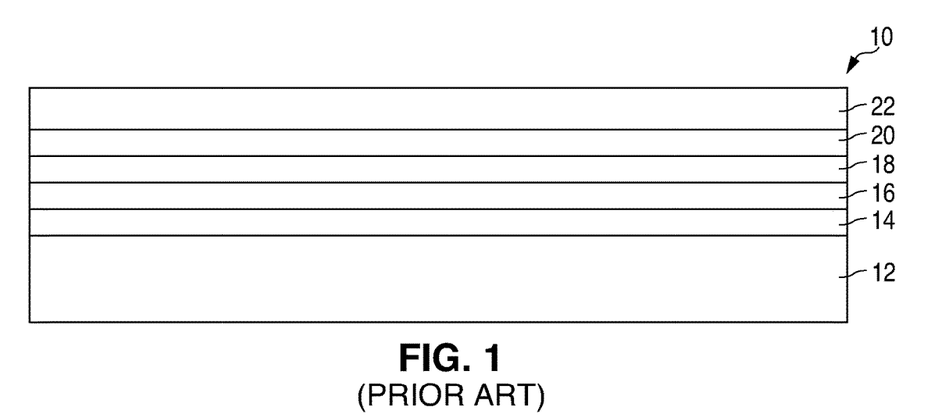
FIG. 1 is a cross-section of an LED wafer containing thousands of flip-chip LEDs. The LED wafer may be conventional. The individual anode and cathode metal pads for each LED are represented by a continuous top metal layer.

FIG. 1 is a cross-section of an LED wafer 10. A growth substrate 12 may be sapphire or other suitable growth substrate for LEDs. In the example of forming blue flip-chip LEDs, the growth substrate 12 may be a transparent sapphire substrate.

Over the growth substrate 12 is epitaxially grown a lattice matching layer 14, followed by one or more n-type layers 16, followed by a quantum well active layer 18, followed by one or more p-type layers 20, followed by a metal layer 22 that is patterned to form anode and cathode metal pads for each of the LEDs electrically contacting the p-type layers 20 and n-type layers 16, respectively.

The LED wafer 10 will typically contain thousands of flip-chip LEDs. The individual anode and cathode metal pads for each LED are represented by a continuous top metal layer 22. The LED wafer 10 may be conventional and well-known. Many other types of LED wafers and materials may be used with the present invention, since the invention is directed to packaging rather than to the particular epitaxial layers or growth substrate used in the LED. Although the invention is described for a light emitting diode, those skilled in the art will appreciate that the invention can be used with any light emitting semiconductor device where the light is emitted in more than one direction.

Figure 2:
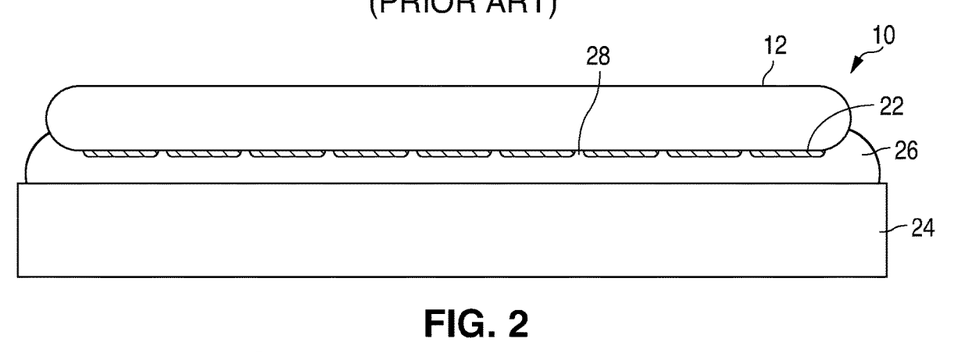
FIG. 2 is a cross-sectional view illustrating the LED wafer mounted on a temporary carrier, such as a glass wafer, using an adhesive, with the growth substrate (e.g., sapphire) facing up.

As shown in FIG. 2, the LED wafer 10 is then flipped over (with respect to FIG. 1) and adhesively secured to a temporary carrier 24, such as a glass wafer, via a UV-curable adhesive 26 or other suitable adhesive. The metal layer 22 of the LEDs is face down and the growth substrate 12 is face up. Indented areas 28 in the LED wafer 10 represent spaces between portions of the metal layer 22 on the bottom of each LED corresponding to singulation lines.

Figure 3:
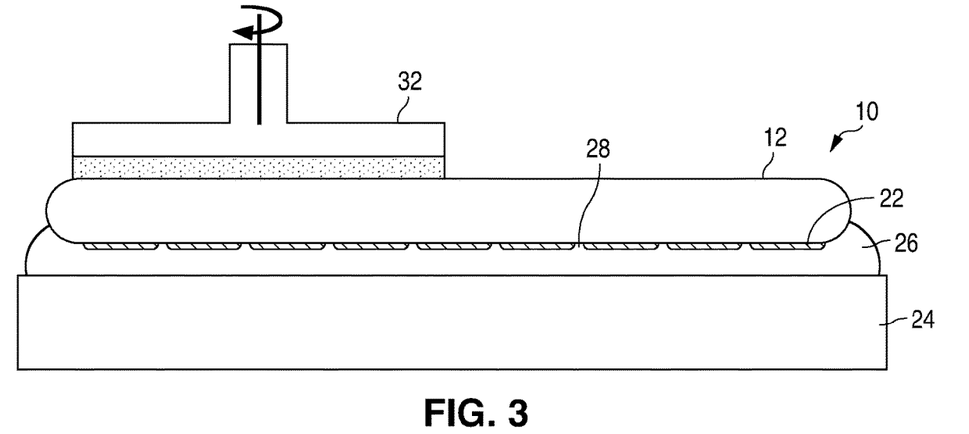
FIG. 3 illustrates the growth substrate being ground down for thinning and roughening.

As shown in FIG. 3, the growth substrate 12 is ground down by a conventional grinder wheel 32 to a desired thickness, such as to about 200 microns or less. Roughening and thinning the growth substrate 12 improves light extraction.

Figure 4:
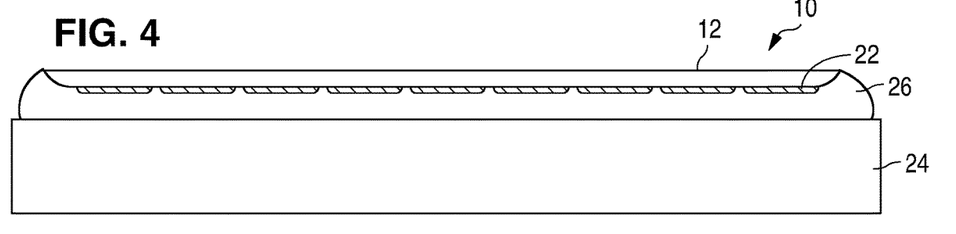
FIG. 4 illustrates the LED wafer after the growth substrate has been sufficiently ground down.

FIG. 4 illustrates the LED wafer 10 after the growth substrate 12 has been sufficiently ground down.

Figure 5:
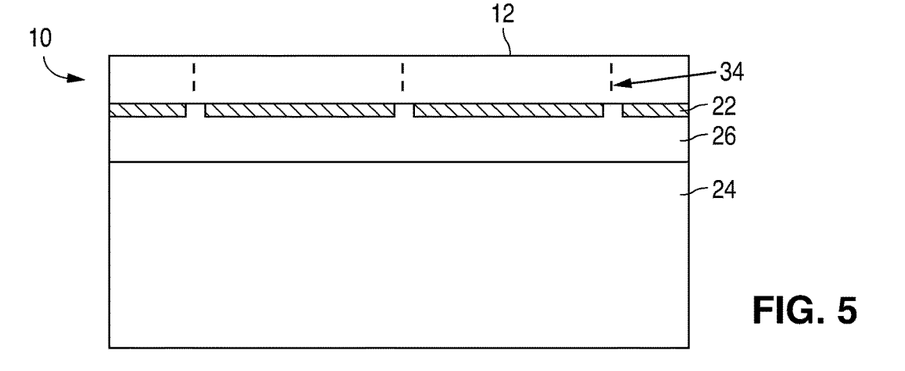
FIG. 5 illustrates partial dicing performed on the LED wafer to create cracks defining the edges of each LED.

FIG. 5 is a magnified view of a portion of the LED wafer 10 illustrating the creation of cracks 34 along the intended singulation lines as a result of "stealth dicing." Stealth dicing is a known technique that uses a focused laser to create cracks in a crystal along singulation lines. Other techniques can be used to weaken the growth substrate 12 along the singulation lines, such as scribing, partial sawing, or etching.

Figure 6:
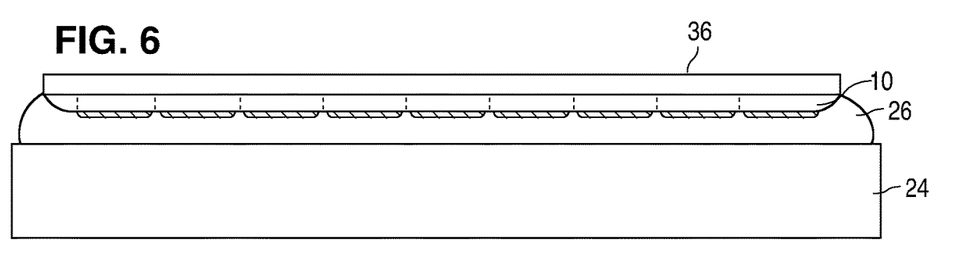
FIG. 6 illustrates a film of photoresist being applied to the top of the growth substrate.

FIG. 6 illustrates a photoresist film 36, such as BCB or BPO, laminated on, spun on, or otherwise deposited over the growth substrate 12 surface. The thickness of the photoresist film 36 coincides with the thickness of the phosphor layer to be later deposited. In one embodiment, the thickness of the photoresist film 36 will typically be 50-100 microns. The photoresist film 36 is a temporary layer that is later removed.

Figure 7:
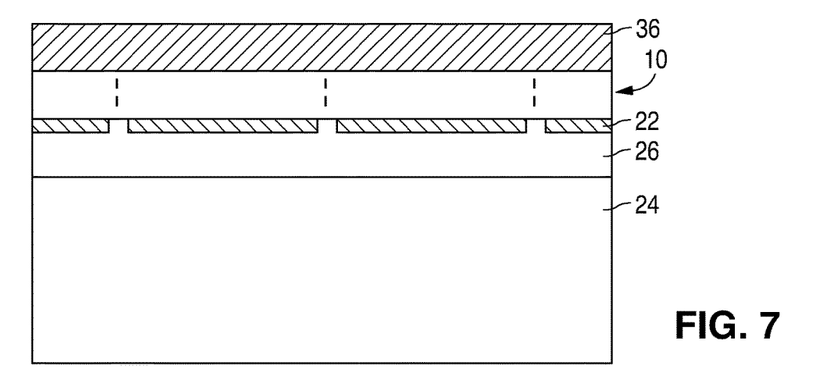
FIG. 7 illustrates the photoresist film in greater detail.

FIG. 7 illustrates the photoresist film 36 in greater detail. Materials other than a photoresist can be used, but the material should be dissolvable in a solvent or otherwise capable of being removed.

Figure 8:
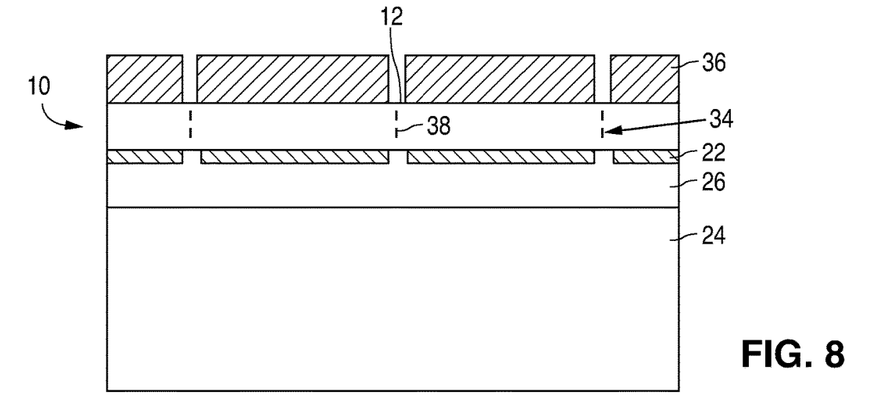
FIG. 8 illustrates the photoresist film patterned using a photolithographic process to expose the growth substrate along the intended singulation lines.

FIG. 8 illustrates the photoresist film 36 patterned using a photolithographic process (e.g., exposed to masked UV and developed) to expose the growth substrate 12 along the intended singulation lines 38.

Figure 9:
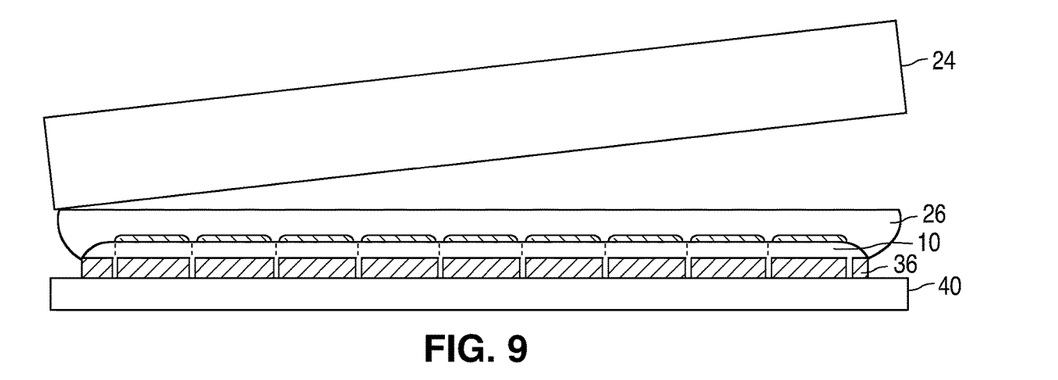
FIG. 9 illustrates the photoresist film surface being stuck on a mounting tape and the temporary carrier being removed from the adhesive.

FIG. 9 illustrates the photoresist film 36 surface being stuck on a mounting tape 40 and the temporary carrier 24 being removed from the adhesive 26. The adhesive 26 may be weak to allow the carrier 24 to be pulled off, or the adhesive 26 may be heated or partially dissolved to weaken it.

Figure 10:
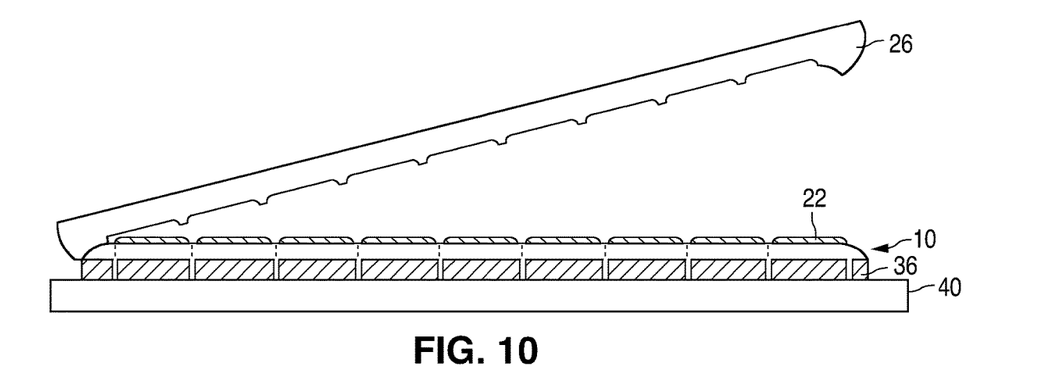
FIG. 10 illustrates the adhesive being removed to expose the metal contacts on the LED wafer.

FIG. 10 illustrates the adhesive 26 being removed to expose the metal layer 22 on the LED wafer 10. The adhesive 26 may be dissolved, heated, or weakened in another suitable way to avoid the adhesive 26 delaminating the metal layer 22 from the LED wafer 10.

Figure 11:
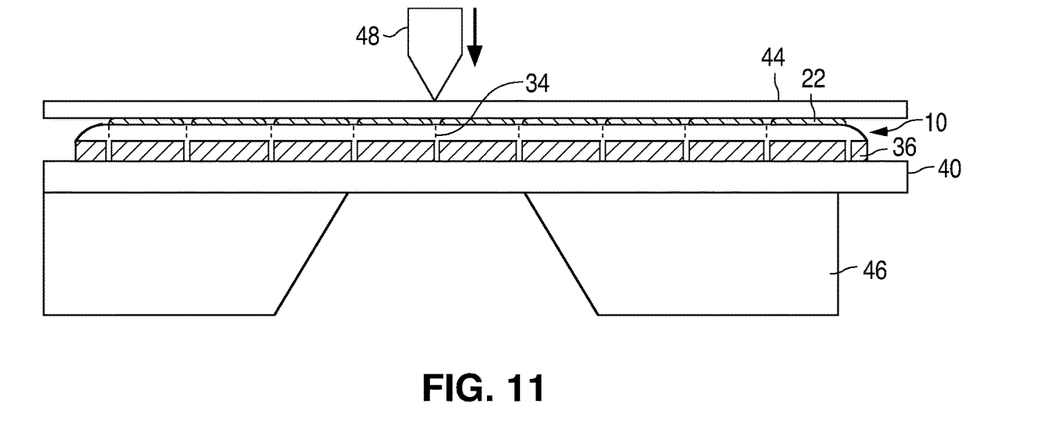
FIG. 11 illustrates the LED wafer being diced using a breaking process along the cracks formed in FIG. 5.

FIG. 11 illustrates a tacky Mylar tape 44 applied to the metal layer 22 for protection, followed by the LED wafer 10 being mounted on a conventional dicing surface 46 for breaking along the singulation lines 34. A sharp tool 48 presses on the singulation lines 34 that have been weakened by the stealth dicing in FIG. 5 and breaks the LED wafer 10 along the singulation lines 34.

Figure 12A:
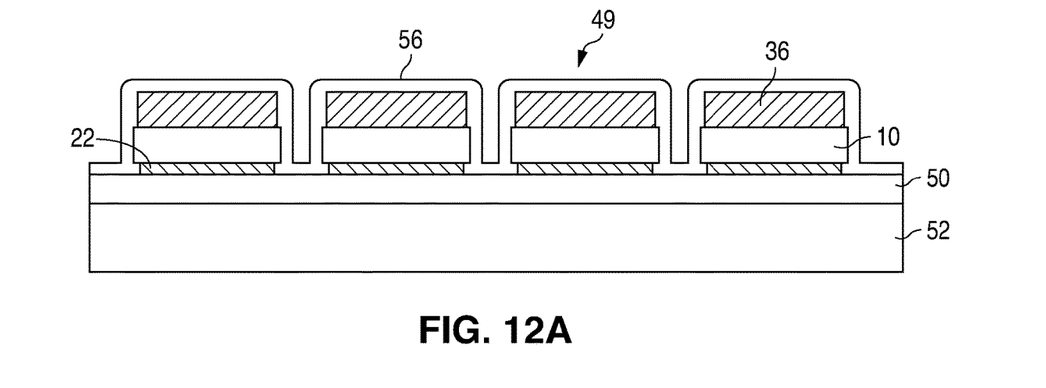
FIG. 12A illustrates how the singulated LEDs have been mounted on another temporary carrier, using a double-sided tape, with the photoresist film face up, and a reflective material, such as TiO2 particles in a transparent binder, being deposited to cover the tops and sides of the LEDs as well as the area between the LEDs.

As shown in FIG. 12A, the singulated LEDs 49, still adhered to the Mylar tape 44, are then removed from the dicing surface 46, and an automatic pick and place machine removes the LEDs 49 from the Mylar tape 44 and places them on a double-sided tacky tape 50. The tape 50 is adhered to another temporary carrier 52, which may be ceramic, glass, etc. Spaces are provided between the LEDs 49.

Then, a reflective material 56 is deposited over the tops and sides of the LEDs 49 to encapsulate them. The reflective material 56 may comprise reflective particles, such as TiO2, ZiO2, etc., in a transparent binder and deposited by spraying or other technique. Alternatively, the reflective particles may be deposited by electrophoresis. The thickness of the reflective material 56 is such that the amount of light that escapes the chip through the phosphor layer is maximized. Note that the reflective material 56 covers areas of the double-sided tacky tape 50 between the LEDs 49.

Figure 12B:
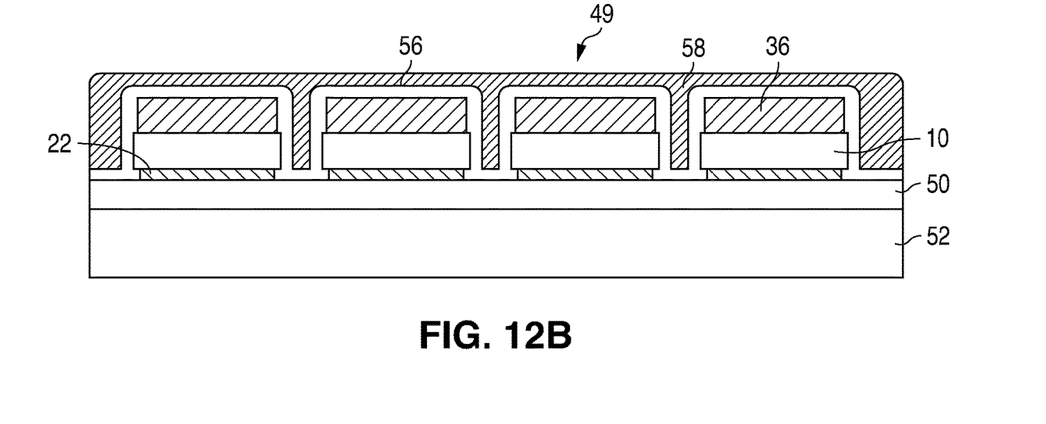
FIG. 12B illustrates an optional sheet molding compound (SMC), such as resin or silicone, deposited over and between the LEDs for forming a protective layer.

FIG. 12B illustrates an alternative embodiment where the structure is then covered with a protective layer 58, such as by molding a sheet molding compound (SMC). The protective layer 58 may be a resin or silicone deposited over and between the LEDs 49. This makes the LED structure more robust and may serve as a moisture barrier.

Figure 13A:
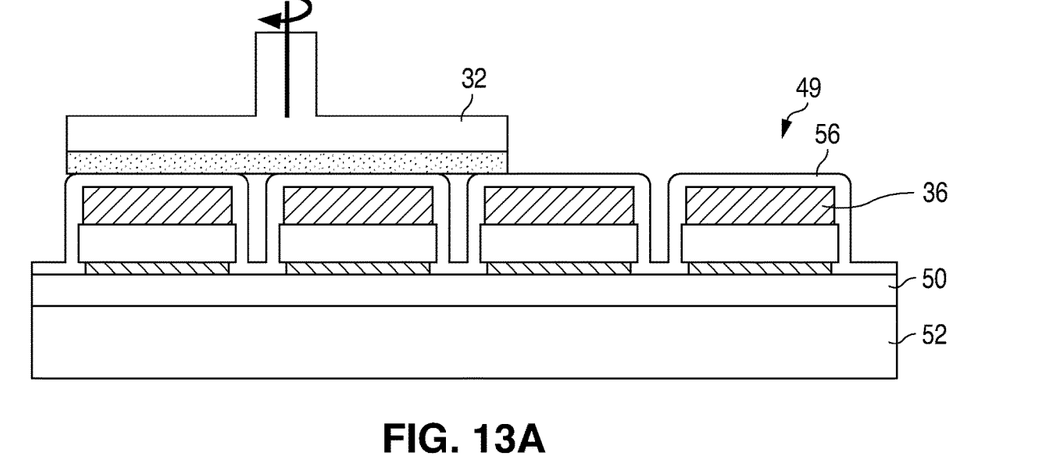
FIG. 13A illustrates the grinding down of the top surfaces of the LEDs in FIG. 12A to expose the photoresist film.

In FIG. 13A, a conventional grinder wheel 32 is used to grind down the top surface of the reflective material 56 from FIG. 12A to expose the photoresist film 36.

Figure 13B:
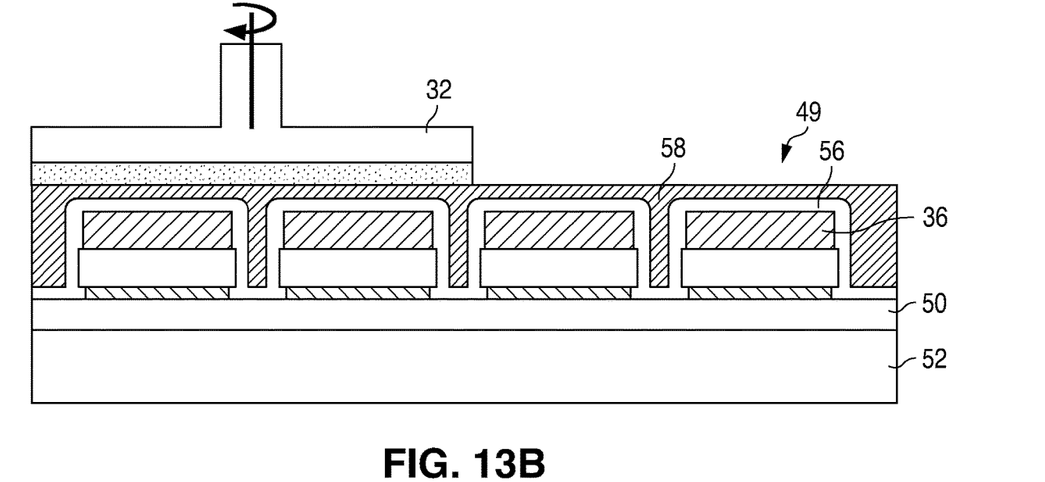
FIG. 13B illustrates the grinding down of the top surfaces of the LEDs in FIG. 12B to expose the photoresist film.

Alternatively, in FIG. 13B, the grinder wheel 32 is used to grind down the top surface of the reflective material 56 from FIG. 12B to expose the photoresist film 36.

After the photoresist film 36 is exposed, the structure is exposed to a solvent (e.g., dipped) to dissolve the photoresist film 36. Such solvents for the particular photoresist used are well-known.

Figure 14A:
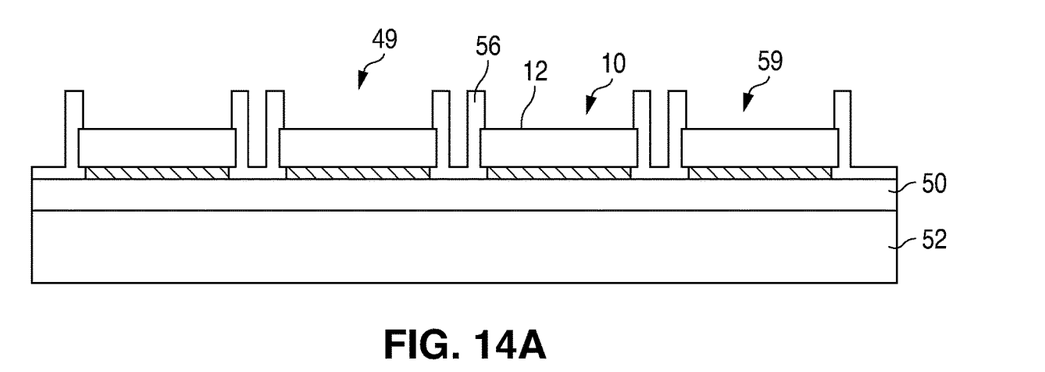
FIG. 14A illustrates the exposed photoresist film of FIG. 13A dissolved away with a solvent to form a reflective cavity over the growth substrate.
Figure 14B:
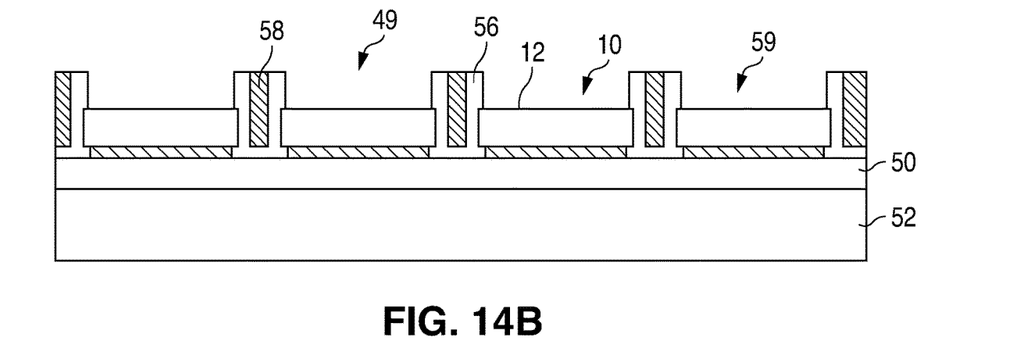
FIG. 14B illustrates the exposed photoresist film of FIG. 13B dissolved away with a solvent to form a reflective cavity over the growth substrate.

FIG. 14A illustrates the resulting structure after the photoresist film 36 of FIG. 13A has been dissolved, and FIG. 14B illustrates the resulting structure after the photoresist film 36 of FIG. 13B has been dissolved. The top surface of the growth substrate 12 is exposed. As seen, a cavity 59 is created surrounded by walls of the reflective material 56, where the depth of the cavity 59 is approximately equal to the thickness of the photoresist film 36 prior to being dissolved. Accordingly, the depth of the cavity 59 (which will be filled with a phosphor) can be precisely controlled by the thickness of the photoresist film 36, which is then used to precisely control the thickness of the phosphor layer for consistent color control.

Figure 15:
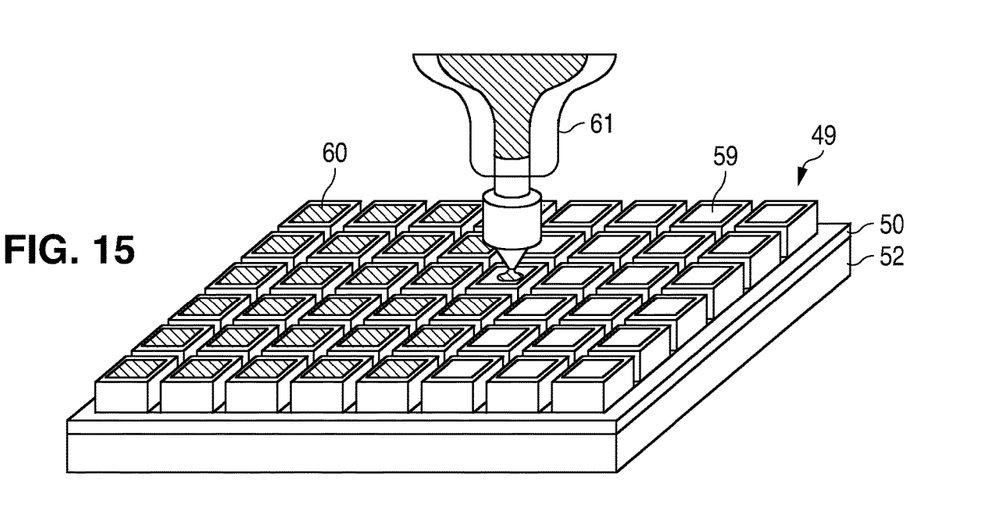
FIG. 15 is a perspective view of a carrier populated with LEDs and illustrates the filling of the reflective cavities with a phosphor, such as phosphor particles in a transparent binder.

In FIG. 15, a phosphor mixture 60 is injected into the cavities 59 using a nozzle 61 and may fill the cavities 59 to the top. The cavities 59 act as a mold so all the deposited phosphor mixture 60 for all the LEDs 49 have precisely the same shape for good color consistency. The amount of phosphor mixture 60 may be pre-measured for each LED 49, or an optical feedback mechanism may be used to fill each cavity 59 to the top.

The phosphor mixture 60 is then cured, such as by heat or UV light. The phosphor mixture 60 may be phosphor particles in a transparent binder, such as silicone. The density and thickness of the cured phosphor mixture 60 determines the amount of wavelength conversion of the blue light, since some blue light passes through the phosphor mixture 60 without being converted. For example, the phosphor may be a yellow YAG phosphor which, when mixed with blue light, creates white light. Any other color light may be generated by selecting one or more light converting materials.

Figure 16A:
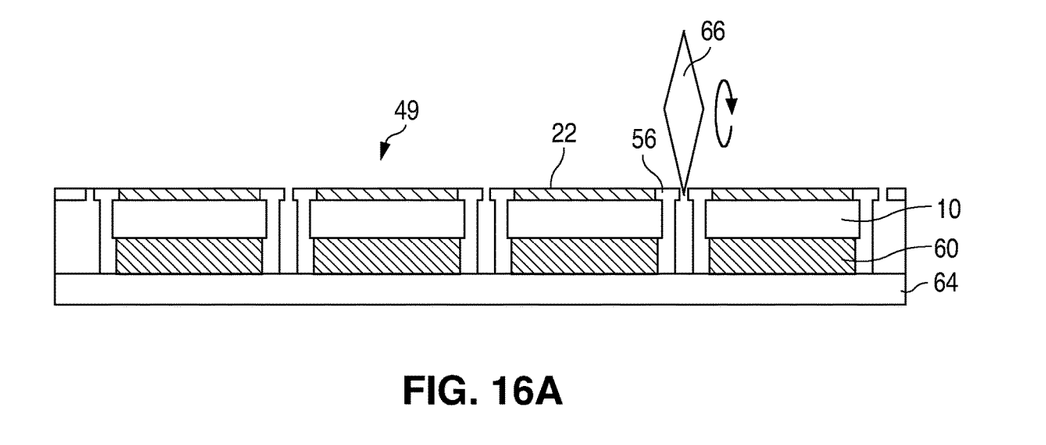
FIG. 16A is a cross-sectional view of the structure of FIG. 15, without the SMC of FIG. 12B, after the phosphor mixture has been cured, where the structure has been flipped over and mounted on a tape (phosphor side down), followed by a sawing or breaking process to separate any residual reflective material between the LED dies.

The tops of the LEDs 49 are then affixed to another tacky tape 64 in FIG. 16A (phosphor mixture 60 on bottom), and the bottoms of the LEDs 49 (metal layer 22) are then removed from the double-sided tacky tape 50. Thus, the portion of the reflective material 56 that was deposited between the LEDs 49 is now on top.

FIG. 16A illustrates the cutting of these connecting portions of the reflective material 56 with a dicing saw 66 to complete the full singulation of the LEDs 49.

Figure 16B:
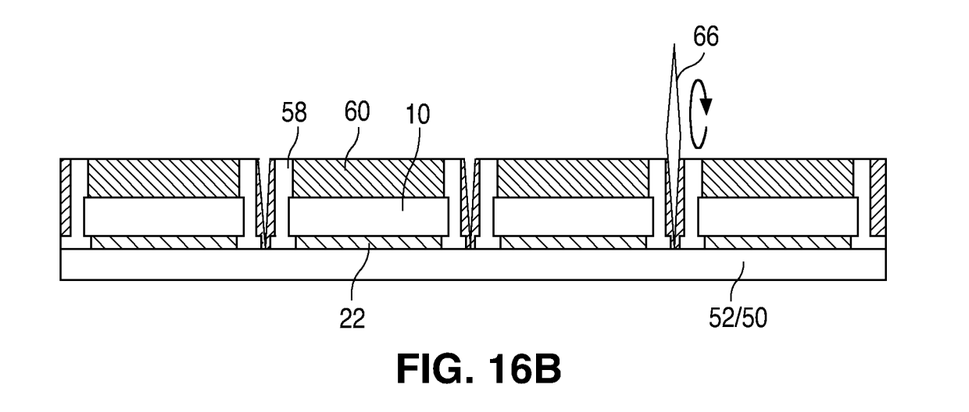
FIG. 16B is a cross-sectional view of the structure of FIG. 15, with the SMC of FIG. 12B, after the phosphor mixture has been cured, where a sawing process separates any residual reflective material and the SMC between the LED dies.

FIG. 16B illustrates a process performed on the structure having the protective layer 58 molded between the LEDs 49. In such a case, the layer of LEDs 49 on the double-sided tacky tape 50 can remain on the tape 50 while the reflective material 56 and protective layer 58 between the LEDs 49 is being sawed since the saw 66 must cut through the entire thickness down to the tape 50 to complete the singulation.

The packaged LEDs 49 may then be picked from the tape 50 or 64 and mounted on a printed circuit board or submount to connect the flip-chip anode and cathode bottom electrodes (part of the metal layer 22) to a power source.

Figure 17:
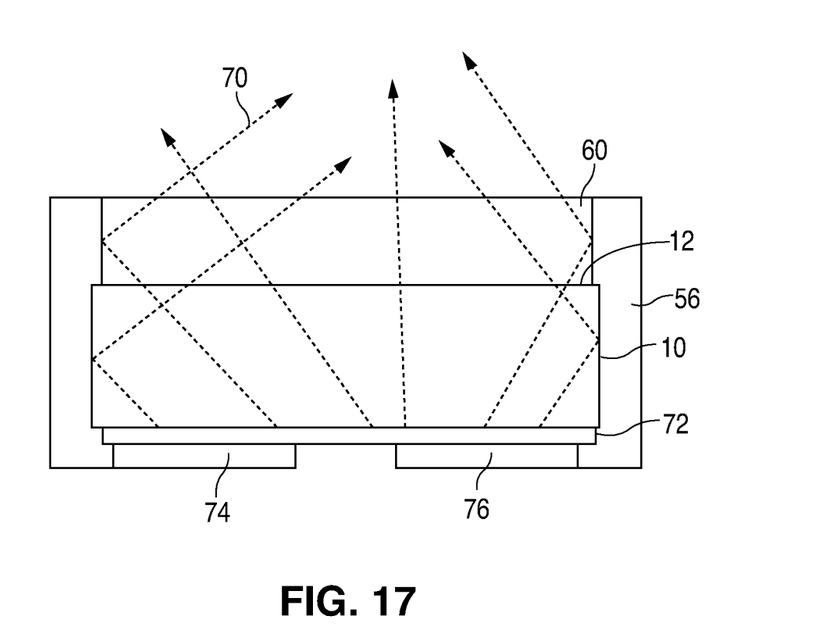
FIG. 17 illustrates a single phosphor-converted flip-chip LED, after removal from the tape in FIG. 16A or 16B, showing how the light rays generated by the active layer and the phosphor are reflected by the reflective material such that all light exits the top surface.

FIG. 17 shows a single energized LED 49 in more detail where light rays 70 emitted from the LED semiconductor layers 72 either directly impinge or pass through the phosphor mixture 60 or reflect off the reflective material 56 forming a wall around the entire LED 49. Side light from the phosphor mixture 60 is also redirected by the reflective material 56. Also shown is the growth substrate 12, the anode electrode 74, and the cathode electrode 76 (as part of the metal layer 22).

Typical sizes of the LED 49 are between 100 microns and 1 mm per side. Virtually 100% of the side light emitted by the LED 49 is directed back into the LED 49 or through the top surface of the LED 49. Therefore, the energized LED appears as a tiny white dot with no blue halo. Any other color may be created.

Quantum dots or a mixture of quantum dots and phosphors may be also used instead of the phosphor mixture 60. Other types of wavelength converting materials are also contemplated by the invention.

In another embodiment, the growth substrate 12 may be removed after the LED semiconductor layers are formed, and another transparent substrate is affixed to the LED semiconductor layers. Accordingly, the term "substrate" may apply to either type of substrate.

Many variations of the described process may be employed while still forming the reflective walls around the LED 49 (for reflecting side light) and creating the reflective cavity 59 (for filling with a wavelength-conversion material). For example, some steps may not be needed for a particular application. Further, additional steps and layers may be added depending on the particular application. In some cases, the step of grinding may be performed by etching, laser ablation, or other techniques. The phosphor mixture may instead be a pre-formed phosphor tile that is placed into the cavity 59.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a light emitting device comprising the following ordered steps:
    (a) providing a plurality of light emitting devices on a carrier, each of the plurality of light emitting devices comprising a stack of semiconductor layers and a first temporary layer over the stack of semiconductor layers;
    (b) depositing a reflective material over the plurality of light emitting devices such that the reflective material conforms to a top surface of the first temporary layer, sides of the stack of semiconductor layers, and the carrier in spaces between the light emitting devices;
    (c) removing the reflective material over the top surface of the first temporary layer of each of the light emitting devices to expose the first temporary layer;
    (d) removing the first temporary layer to form a reflective cavity over each of the plurality of light emitting devices; and
    (e) at least partially filling the reflective cavity with a wavelength-converting material.

2. The method of claim 1 further comprising depositing a protective layer over the reflective material prior to removing the reflective material over the top surface of the first temporary layer.

3. The method of claim 1 wherein the removing the reflective material over the top surface of the first temporary layer to expose the first temporary layer comprises grinding down the reflective material.

4. The method of claim 1 wherein the first temporary layer is a photoresist, and the removing the first temporary layer comprises dissolving the photoresist with a solvent.

5. The method of claim 1 wherein the at least partially filling the reflective cavity with a wavelength-converting material comprises dispensing a phosphor material into the cavity.

6. The method of claim 1 wherein the plurality of light emitting devices are flip-chip light emitting devices with anode and cathode electrodes.

7. The method of claim 1 wherein the stack of semiconductor layers is disposed on a transparent growth substrate for epitaxially growing the semiconductor layers.

8. The method of claim 1, wherein a thickness of the first temporary layer is selected based on a desired thickness for the wavelength-converting material.

9. The method of claim 1, further comprising curing the wavelength-converting material using heat or ultraviolet (UV) light after at least partially filling the cavity with the wavelength-converting material.

10. The method of claim 9, wherein the wavelength-converting material is a phosphor mixture including phosphor particles in a transparent binder.

11. The method of claim 1, wherein an amount of the wavelength-converting material is pre-measured prior to at least partially filling the cavity with the wavelength-converting material or an optical feedback mechanism is used to fill the cavity to the top with the wavelength-converting material.

12. The method of claim 1, wherein the reflective material is deposited in direct contact with the top surface of the temporary layer.

* * * * *